(12) United States Patent
Yoo

(10) Patent No.: US 10,453,514 B2
(45) Date of Patent: *Oct. 22, 2019

(54) FERROELECTRIC MEMORY DEVICE AND METHOD OF MANUFACTURING THE SAME

(71) Applicant: SK hynix Inc., Icheon (KR)

(72) Inventor: Hyangkeun Yoo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/858,056

(22) Filed: Dec. 29, 2017

(65) Prior Publication Data

US 2018/0277191 A1    Sep. 27, 2018

(30) Foreign Application Priority Data

Mar. 21, 2017    (KR) .......................... 10-2017-0035344

(51) Int. Cl.

| | | |
|---|---|---|
| *G11C 11/22* | (2006.01) | |
| *G11C 11/4074* | (2006.01) | |
| *H01L 27/11502* | (2017.01) | |
| *H01L 29/78* | (2006.01) | |
| *H01L 21/28* | (2006.01) | |
| *H01L 29/51* | (2006.01) | |
| *H01L 29/66* | (2006.01) | |
| *H01L 27/1159* | (2017.01) | |

(52) U.S. Cl.
CPC ........ *G11C 11/223* (2013.01); *G11C 11/4074* (2013.01); *H01L 21/28291* (2013.01); *H01L 27/1159* (2013.01); *H01L 27/11502* (2013.01); *H01L 29/516* (2013.01); *H01L 29/6684* (2013.01); *H01L 29/78391* (2014.09)

(58) Field of Classification Search
CPC . G11C 11/223; G11C 11/4074; H01L 29/516; H01L 27/1159; H01L 29/6684; H01L 21/28291; H01L 29/78391; H01L 27/11502
USPC ........................................................ 365/145
See application file for complete search history.

(56) References Cited

U.S. PATENT DOCUMENTS

| | | | |
|---|---|---|---|
| 6,091,621 A | 7/2000 | Wang et al. | |
| 8,445,974 B2 | 5/2013 | Chidambarrao et al. | |
| 9,159,829 B1 * | 10/2015 | Ramaswamy | .... H01L 29/78391 |
| 9,634,134 B2 * | 4/2017 | Ting | ............... H01L 27/10876 |

* cited by examiner

*Primary Examiner* — Fernando Hidalgo

(57) ABSTRACT

A ferroelectric memory device according to an embodiment includes a substrate, a ferroelectric gate insulation layer disposed along an inner wall of a trench formed in the substrate, and a gate electrode layer disposed on the ferroelectric gate insulation layer. The ferroelectric gate insulation layer has a variable thickness on the inner wall of the trench.

10 Claims, 19 Drawing Sheets

1

FERROELECTRIC MEMORY DEVICE AND METHOD OF MANUFACTURING THE SAME

CROSS-REFERENCE TO RELATED APPLICATION

The present application claims priority under 35 U.S.C 119(a) to Korean Patent Application No. 10-2017-0035344, filed on Mar. 21, 2017, which is herein incorporated by reference in its entirety.

BACKGROUND

1. Technical Field

Embodiments of the present disclosure relate to a ferroelectric memory device and a method of manufacturing the same.

2. Related Art

Generally, a ferroelectric material refers to a material having spontaneous electrical polarization in a state in the absence of an applied external electric field. More specifically, a ferroelectric material can maintain either of two stable remanent polarization states. Thus, a ferroelectric material may be utilized to store digital information in a nonvolatile manner. For example, binary information "0" or "1" may be stored in remanent polarization states.

Recently, a technique for storing a plurality of different levels of logic information by changing a fraction of a switchable domain region in a ferroelectric material by adjusting a magnitude of an external electric field has been studied. In order for one such technique to be effectively applied to a nonvolatile memory device having a plurality of ferroelectric memory cells, during a read operation for a target memory cell, or a write operation for a memory cell adjacent to a target memory cell, a partially switched polarization orientation state needs to be reliably maintained in the target memory cell.

SUMMARY

In an aspect of the present disclosure, a ferroelectric memory device includes a substrate, a ferroelectric gate insulation layer disposed along an inner wall of a trench formed in the substrate, and a gate electrode layer disposed on the ferroelectric gate insulation layer. The ferroelectric gate insulation layer may include a ferroelectric material. The ferroelectric gate insulation layer has a variable thickness on an inner wall of the trench.

In another aspect of the present disclosure, a ferroelectric memory device includes a substrate having a source region and a drain region, and a ferroelectric gate insulation layer having a ferroelectric material, and a gate electrode layer. The ferroelectric gate insulation layer and the gate electrode layer are disposed along an inner wall of a trench formed in the substrate. The ferroelectric gate insulation layer has a variable thickness on the inner wall of the trench. When a predetermined write voltage is applied to the gate electrode layer, the ferroelectric gate insulation layer has switching or switchable regions of polarization orientation, of different sizes, depending on a thickness of the ferroelectric gate insulation layer.

In yet another aspect of the present disclosure, in a method of manufacturing a ferroelectric memory device, a trench is formed in a substrate doped with a first conductivity type. A ferroelectric gate insulation layer, having a variable thickness along an inner wall of the trench, is formed in the trench. A gate electrode layer is formed in the trench on the ferroelectric gate insulation layer. A source region and a drain region, each doped with a second conductivity type, are formed in the substrate at both ends or opposite sides of the trench, respectively.

DETAILED DESCRIPTION

Figure 1A:
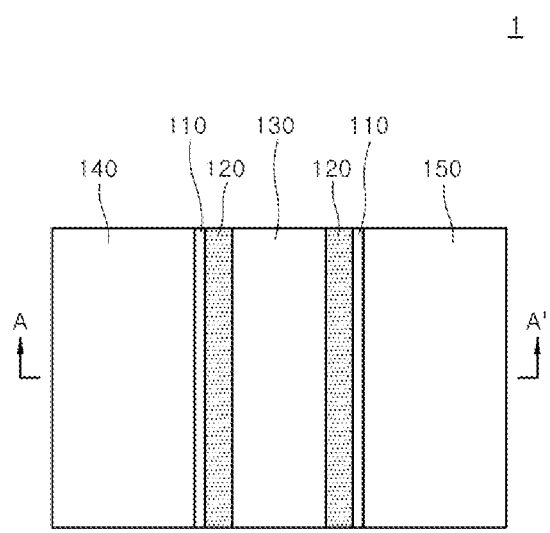
FIG. 1A is a plan view illustrating a ferroelectric memory device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If a first element is referred to as located on a second element, it may be understood that the first element is directly located on the second element; that an additional element may be interposed between the first element and the second element; or that a portion of the first element is directly located on a portion of the second element. The same reference numerals may refer to the same elements throughout the specification.

In addition, expression of a singular form of a word includes the plural forms of the word unless clearly used otherwise in the context of the disclosure. The terms "comprise", "have" or "include" are intended to specify the presence of a feature, a number, a step, an operation, an element, a component, a part, or combinations thereof, but the terms do not preclude the presence or possibility of the addition of one or more other features, numbers, steps, operations, elements, components, parts, or combinations thereof.

Further, each step or process in a method or a manufacturing method need not be performed in any order set forth in the disclosure unless a specific sequence is explicitly described. In other words, each step or process in a method or manufacturing method disclosed herein may be performed sequentially in the stated order, may be performed out of sequence from the stated order, or may be performed substantially at the same time as one or more other steps or processes. The steps or processes may also be performed in a reverse order.

Figure 1B:
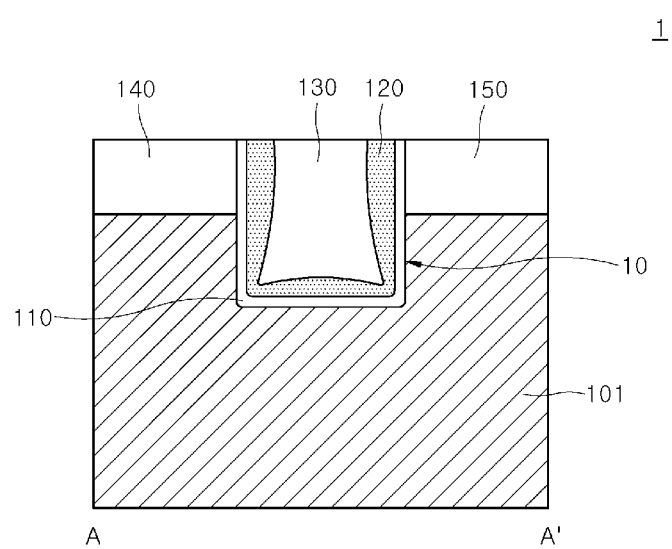
FIG. 1B is a cross-sectional view schematically illustrating the ferroelectric memory device taken along the line A-A' of FIG. 1A.
Figure 2:
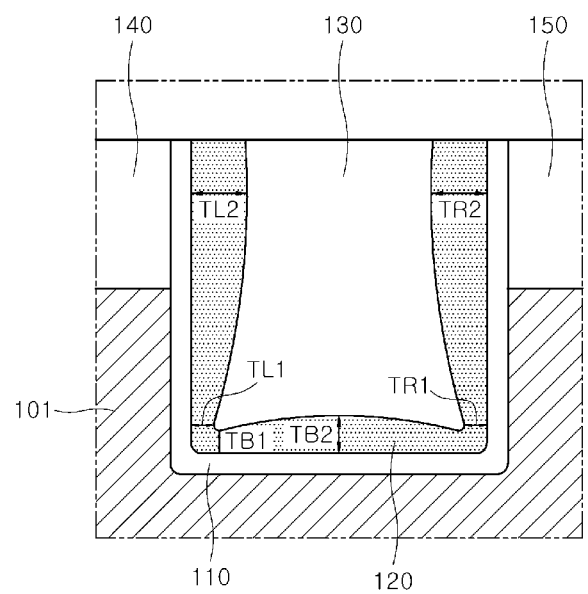
FIG. 2 is an enlarged view of a portion of the ferroelectric memory device of FIGS. 1A and 1B.

FIG. 1B is a cross-sectional view schematically illustrating a ferroelectric memory device 1 of FIG. 1A according to an embodiment of the present disclosure. FIG. 2 is an enlarged view of a portion of the ferroelectric memory device 1 of FIGS. 1A and 1B. The ferroelectric memory device 1 according to this embodiment may be a transistor type memory device having a gate structure buried in a trench.

Referring to FIGS. 1A, 1B and 2, in an embodiment, the ferroelectric memory device 1 may include a substrate 101, a ferroelectric gate insulation layer 120, and a gate electrode layer 130. The ferroelectric gate insulation layer 120 may be disposed along an inner wall of a trench 10 formed in the substrate 101. In some cases, the ferroelectric memory device 1 may further include an interfacial insulation layer 110 disposed between the inner wall of the trench 10 and the ferroelectric gate insulation layer 120. In addition, the ferroelectric memory device 1 may further include source and drain regions 140 and 150, respectively, disposed in the substrate 101 at both ends or opposite sides of the trench 10.

The substrate 101 may include a semiconductor material. The substrate 101 may, for example, be a silicon (Si) substrate or a germanium (Ge) substrate. As another example, the substrate 101 may be a compound semiconductor substrate such as a gallium arsenide (GaAs) substrate. The substrate 101 may, for example, be doped with p-type impurities.

Referring to FIGS. 1B and 2, in an embodiment, a trench 10 may be formed in a substrate 101. The trench 10 may be formed to extend from a surface of the substrate 101 to an inner region of the substrate 101. An interfacial insulation layer 110 may be disposed along an inner wall of the trench 10. The interfacial insulation layer 110 may include, for example, a nitride, an oxide, or an oxynitride. The interfacial insulation layer 110 may include a silicon oxide, a silicon nitride, a silicon oxynitride, an aluminum oxide, or a combination of two or more thereof, as non-limiting examples.

The interfacial insulation layer 110 can function to suppress diffusion of materials between the substrate 101 and a ferroelectric gate insulation layer 120. The interfacial insulation layer 110 can also function to suppress the transfer of electric charges conducted through a channel of the substrate 101 to the ferroelectric gate insulation layer 120 in a read operation of the ferroelectric memory device 1. In some other embodiments, the interfacial insulation layer 110 may be omitted.

In an embodiment, a ferroelectric gate insulation layer 120 may be disposed on an interfacial insulation layer 110. The ferroelectric gate insulation layer 120 may include a ferroelectric material, and may have remanent polarization. The remanent polarization may change a channel resistance by inducing electrons in the substrate 101 under the ferroelectric gate insulation layer 120 or interfacial insulation layer 110.

The ferroelectric gate insulation layer 120 may have a variable thickness along an inner wall of the trench 10. The thickness of the ferroelectric gate insulation layer 120 may vary between a minimum thickness and a maximum thickness. In an example, the thickness of ferroelectric gate insulation layer 120 may vary from a first thickness TL1 to a second thickness TL2 along a left sidewall of the trench 10, and may vary from a first thickness TR1 to a second thickness TR2 along a right sidewall of the trench 10. In addition, the ferroelectric gate insulation layer 120 may vary from a first thickness TB1 to a second thickness TB2 along a bottom surface of the trench 10. In some cases, as illustrated in FIG. 2, an interfacial insulation layer 110 may be disposed between the substrate 101 and ferroelectric gate insulation layer 120, but in other cases, interfacial insulation layer 110 may be omitted.

In some embodiments, a ferroelectric gate insulation layer 120 may be formed on the interfacial insulation layer 110 using a chemical vapor deposition method. The ferroelectric gate insulation layer 120 can be formed with a non-uniform thickness by controlling the conditions of the chemical vapor deposition process such as a process temperature, a process pressure, a source gas flow rate or the like as non-limiting examples. As a result, the ferroelectric gate insulation layer 120 can have a variable thickness. In embodiments in which interfacial insulation layer 110 is omitted, the ferroelectric gate insulation layer 120 can be formed to have a non-uniform thickness on the substrate 101 by controlling conditions of the deposition method or process.

The ferroelectric gate insulation layer 120 may include a hafnium oxide, a zirconium oxide, a hafnium zirconium oxide, or a combination of two or more thereof as non-limiting examples. In an embodiment, the ferroelectric gate insulation layer 120 may include at least one dopant. The dopant may include carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof as non-limiting examples.

In an embodiment, a gate electrode layer 130 may be disposed on a ferroelectric gate insulation layer 120. As illustrated in FIGS. 1B and 2, the gate electrode layer 130 may be disposed to fill the trench 10. An orientation of a remanent polarization of the ferroelectric gate insulation layer 120 can be changed by applying a voltage to the ferroelectric insulation layer 120 through the gate electrode layer 130.

The gate electrode layer 130 may include a conductive material. The gate electrode layer 130 may include tungsten (W), titanium (Ti), copper (Cu), aluminum (Al), platinum (Pt), iridium (Ir), ruthenium (Ru), a tungsten nitride, a titanium nitride, a tantalum nitride, an iridium oxide, a ruthenium oxide, a tungsten carbide, a titanium carbide, a tungsten silicide, a titanium silicide, a tantalum silicide, or a combination or an alloy thereof as non-limiting examples. The gate electrode layer 130 may be formed as a single layer or formed in multiple layers.

In an embodiment, source and drain regions 140 and 150, respectively, may be disposed in a substrate 101 at respective ends of a trench 10. The source and drain regions 140 and 150 may be doped with a dopant having a conductivity type opposite to the conductivity type of the substrate 101. For example, the source and drain regions 140 and 150 may be doped with n-type dopants, and the substrate may be also doped with p-type dopants.

Figure 3A:
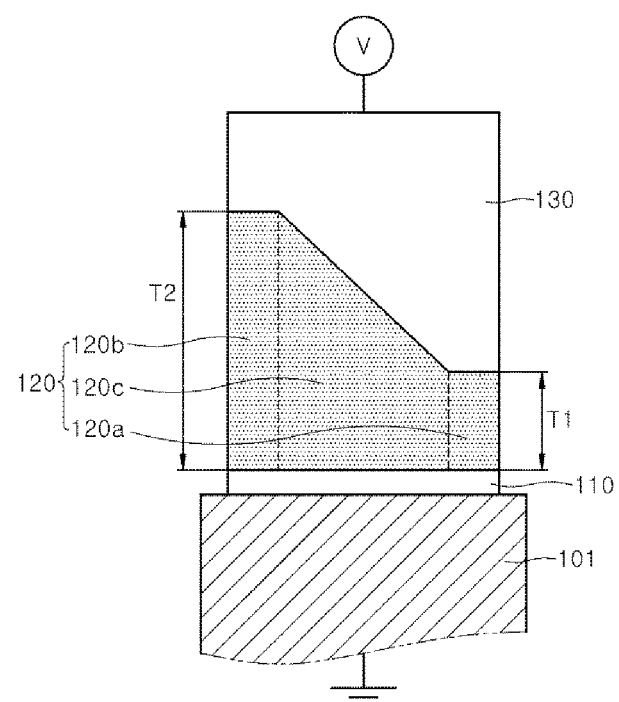
FIGS. 3A and 3B are views schematically illustrating a method of driving a ferroelectric memory device according to an embodiment of the present disclosure.
Figure 3B:
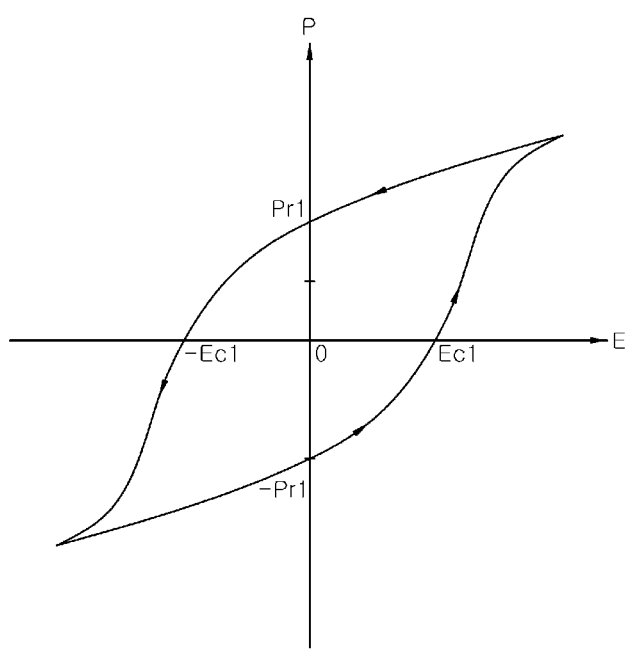

FIGS. 3A and 3B are views schematically illustrating a method of driving a ferroelectric memory device according to an embodiment of the present disclosure. The configuration of the ferroelectric memory device illustrated in FIGS. 3A and 3B is substantially the same as that of a ferroelectric memory device 1 of an embodiment described above and with reference to FIGS. 1B and 2. More specifically, FIG. 3A is an enlarged cross-sectional view of a portion of a ferroelectric memory device according to an embodiment of the present disclosure. In FIG. 3A, a ferroelectric insulation layer 120 is disposed on an interfacial insulation layer 110, which in turn is disposed on a substrate 101. A thickness of the ferroelectric gate insulation layer 120 illustrated in FIG. 3A may vary between a minimum thickness T1 and a maximum thickness T2. FIG. 3B is a graph schematically illustrating a hysteresis loop of a ferroelectric gate insulation layer according to an embodiment of the present disclosure.

Referring to FIG. 3A, in an embodiment, a predetermined write voltage may be provided from a power supply V to a gate electrode layer 130. A ferroelectric gate insulation layer 120 may have a first region 120a in which a first electric field corresponding to the minimum thickness T1 is formed, a second region 120b in which a second electric field corresponding to the maximum thickness T2 is formed, and a third region in which a third electric field that is greater than the first electric field and less than the second electric field is formed.

In an embodiment, a ferroelectric gate insulation layer 120 may have a ferroelectric characteristic along the same hysteresis loop throughout the first region 120a to the third region 120c. For example, referring to FIG. 3B, the ferroelectric gate insulation layer 120 may have a pair of remanent polarization Pr1, −Pr1, and a pair of coercive electric fields Ec1, −Ec1 substantially symmetrical with respect to the origin. Therefore, the ferroelectric gate insulation layer 120 may have the same remanent polarization Pr1, −Pr1 and the coercive electric fields Ec1, −Ec1 throughout the first region 120a to the third region 120c.

Referring to FIGS. 3A and 3B again, if an absolute value of the first electric field in a first region 120a is less than an absolute value of the coercive electric fields Ec1, −Ec1 of the ferroelectric gate insulation layer 120, then a polarization orientation of the ferroelectric gate insulation layer 120 in first region 120 might not be changed by the write voltage.

In another embodiment, if the absolute value of the first electric field is equal to or greater than the absolute value of the coercive electric field Ec1, −Ec1, and the absolute value of the second electric field is less than the absolute value of the coercive electric fields Ec1, −Ec1, then the polarization orientation of the first region 120a and at least a portion of the third region 120c may be changed by the write voltage. As the magnitude of the write voltage is changed, the size of the portion of the third region 120c in which the polarization orientation changes may also be changed. Accordingly, a plurality of levels of polarization states that differ from each other can be implemented according to the sizes of portions of the third region 120c in which the polarization orientation is changed.

In yet another embodiment, if the absolute value of the second electric field in second region 120b is equal to or greater than the absolute value of the coercive electric fields Ec1, −Ec1, then the polarization orientation of the first to third regions 120a, 120b and 120c may be changed by the write voltage.

In an embodiment, a first write voltage capable of switching the polarization orientation of a first region 120a may be applied to a ferroelectric gate insulation layer 120 to write a first polarization orientation state in the ferroelectric gate insulation layer 120. In another embodiment, a second write voltage capable of switching the polarization orientation of a first region 120a and a portion of a third region 120c may be applied to a ferroelectric gate insulation layer 120 to write a second polarization orientation state in ferroelectric gate insulation layer 120. In yet another embodiment, a third write voltage capable of switching the polarization orientation of all of the first to third regions 120a, 120b and 120c may be applied to a ferroelectric gate insulation layer 120 to write a third polarization orientation state in ferroelectric gate insulation layer 120.

In further embodiments, the write voltage may be selected from a range of write voltages capable of switching the polarization orientation of a first region 120a and a portion of a third region 120c. Thus, the size of the portion where the orientation is changed due to an application of a write voltage may vary depending on the write voltage, and a plurality of levels of polarization states may be implemented.

As described above, according to an embodiment of the present disclosure, a ferroelectric memory device 1 may include a ferroelectric gate insulation layer 120 and a gate electrode layer 130 that are disposed along an inner wall of a trench 10 formed in a substrate 101. The ferroelectric gate insulation layer 120 may have a variable thickness on the inner wall of the trench 10.

When a predetermined write voltage is applied to the gate electrode layer 130, electric fields of different magnitudes can be formed in the ferroelectric gate insulation layer 120 depending on the thickness of the ferroelectric gate insulation layer 120. As the write voltage is changed, the size of a region in which an electric field is greater than a coercive electric field of the ferroelectric gate insulation layer 120 can also change. The polarization orientation of the ferroelectric gate insulation layer 120 can be changed in the region where an electric field that is greater in magnitude than the coercive electric field is formed.

As a result, the size of a region where the polarization orientation of the ferroelectric gate insulation layer 120 is changed can be effectively controlled according to the applied write voltage. Since different polarization orientation states can be defined depending on the size of the region where the polarization orientation is changed, a plurality of levels of logic information can be reliably stored in the ferroelectric memory device 1.

The stored plurality of levels of logic information can be read out by measuring a current that conducts between the source region 140 and the drain region 150 while applying a read voltage to the gate electrode layer 130. Depending on the different polarization orientation states of the ferroelectric gate insulation layer 120, different channel currents can be measured. The read voltage may be small so as not to change the polarization orientation state stored in the ferroelectric gate insulation layer 120.

Figure 4A:
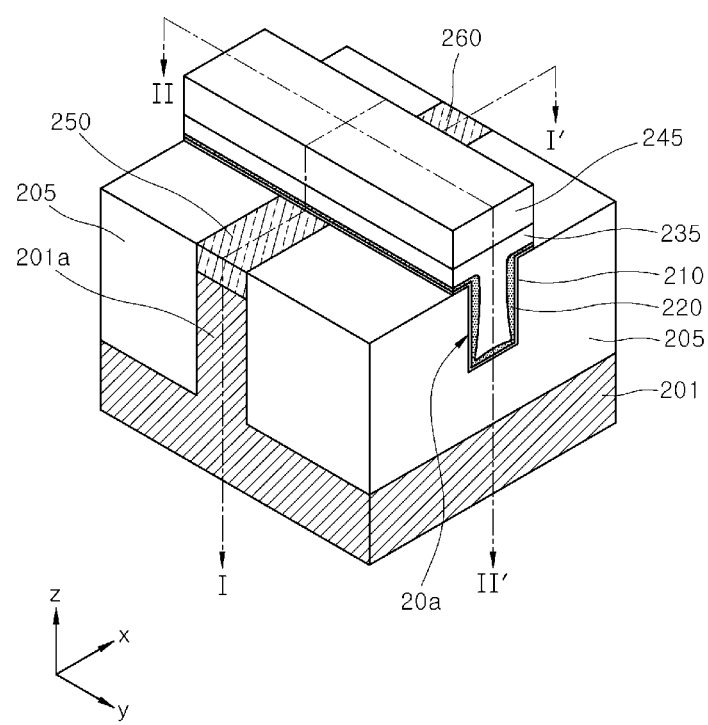
FIGS. 4A to 4C are views schematically illustrating a ferroelectric memory device according to an embodiment of the present disclosure.
Figure 4B:
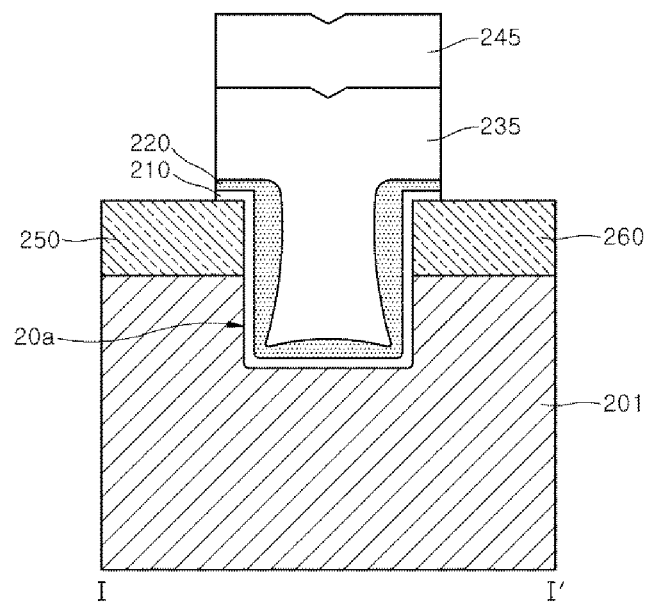
Figure 4C:
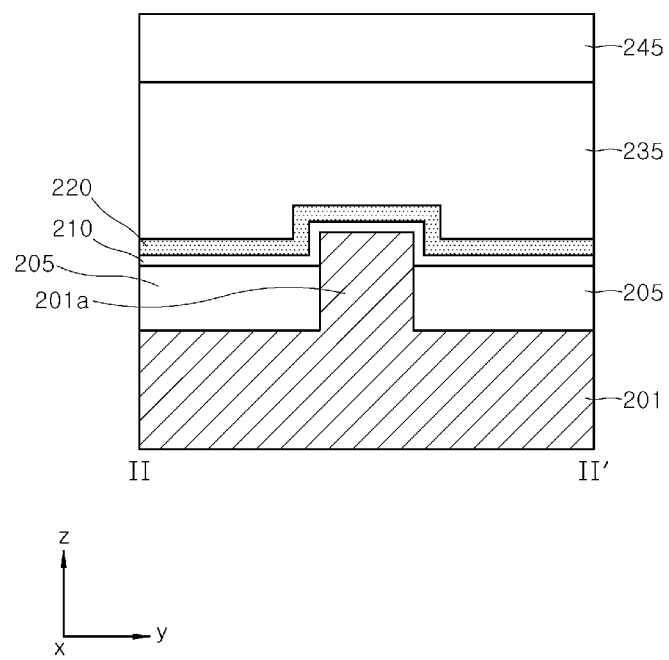

FIGS. 4A to 4C are views schematically illustrating a ferroelectric memory device 2 according to an embodiment of the present disclosure. More specifically, FIG. 4A is a perspective view of the ferroelectric memory device 2, FIG. 4B is a cross-sectional view of the ferroelectric memory device 2 of FIG. 4A taken along line I-I', and FIG. 4C is a cross-sectional view of the ferroelectric memory device 2 of FIG. 4A taken along line II-II'. In an example, a ferroelectric memory device 2 illustrated in FIGS. 4A to 4C may be a three-dimensional transistor device having a saddle fin structure.

Referring to FIGS. 4A to 4C, a fin structure 201a may be disposed to protrude upward on a substrate 201. The substrate 201 may, for example, be substantially similar to substrate 101 described above and with reference to FIGS. 1B and 2. In an embodiment, the substrate 201 may be a doped silicon substrate. In an embodiment, the fin structure 201a may be made of the same material as the substrate 201. The fin structure 201a may be arranged along an x-direction as illustrated in FIG. 4A.

Referring to FIGS. 4A and 4C, in an embodiment, an insulation layer 205 may be disposed to surround the fin structure 201a on the substrate 201. The insulation layer 205 may be disposed such that an upper surface thereof is coplanar with an upper surface of the fin structure 201a.

Referring to FIGS. 4A and 4B, in an embodiment, an interfacial insulation layer 210 may be disposed along an inner wall of a first trench 20a formed in a saddle-type fin structure. A ferroelectric insulation layer 220 may be disposed on the interfacial insulation layer 210. As illustrated in FIG. 4B, the gate insulation layer 220 may have a variable thickness along an inner wall of the first trench 20a or along the interfacial insulation layer 210 disposed in the first trench 20a. The configuration of the interfacial insulation layer 210 and ferroelectric gate insulation layer 220 may be substantially the same as the configuration of the interfacial insulation layer (110 of FIG. 1B) and ferroelectric gate insulation layer (120 of FIG. 1B) of the ferroelectric memory device 1 described above and with reference to FIGS. 1B and 2. As illustrated in FIG. 4C, the interfacial insulation layer 210 and ferroelectric gate insulation layer 220 may be disposed on the upper surface and a part of the side surface of the fin structure 201a.

A gate electrode layer 235 and an upper conductive layer 245 may be sequentially disposed on the ferroelectric gate insulation layer 220. The gate electrode layer 235 and the upper conductive layer 245 may extend in an y-direction as illustrated in FIG. 4A. The gate electrode layer 235 and the upper conductive layer 245 may constitute a word line.

The gate electrode layer 235 may include substantially the same material as that of the gate electrode layer (130 of FIG. 1B) described above and with reference to FIGS. 1B and 2. The upper conductive layer 245 may, for example, include a metal material. The upper conductive layer 245 may have a lower electrical resistance than the gate electrode layer 235. The upper conductive layer 245 may include, for example, copper, aluminum, tungsten, or the like as non-limiting examples.

A source region 250 and a drain region 260 may be disposed or formed in the substrate 201 at both ends or opposite sides of the gate electrode layer 235. The source and drain regions 250 and 260 may be formed by doping regions of the substrate 201 with a dopant having a conductivity type opposite to that of the substrate 201. As an example, the source and drain regions 250 and 260 may be doped with n-type dopants, and substrate 101 may be doped with a p-type dopant.

As described above, a ferroelectric memory device 2 of this embodiment may have a ferroelectric gate insulation layer 220 with variable thickness that is disposed inside the first trench 20a of a transistor structure having a saddle-type fin structure. When a predetermined write voltage is applied to the ferroelectric gate insulation layer 220 through gate electrode layer 235, electric fields of different magnitudes may be formed in the ferroelectric gate insulation layer 220, depending on the thickness of the ferroelectric gate insulation layer 220. As the write voltage is changed, a size of a region or portion in ferroelectric gate insulation layer 220, in which an electric field greater in magnitude than a coercive electric field of the ferroelectric gate insulation layer 220, can also be changed. The polarization orientation of the ferroelectric gate insulation layer 220 can be changed in a region or a portion where an applied electric field is greater in magnitude than the coercive electric field of ferroelectric gate insulation layer 220.

As a result, the size of the region where the polarization orientation of the ferroelectric gate insulation layer 220 is changed can be effectively controlled by the magnitude of the applied write voltage. Accordingly, a plurality of different levels of logic information can be reliably stored in ferroelectric memory device 2.

Figure 5:
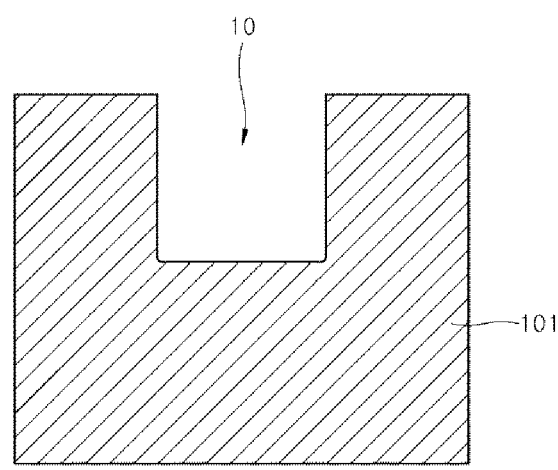
FIGS. 5 to 8 are views schematically illustrating a method of manufacturing a ferroelectric memory device according to an embodiment of the present disclosure.

FIGS. 5 to 8 are views schematically illustrating a method of manufacturing a ferroelectric memory device according to an embodiment of the present disclosure. Referring to FIG. 5, a substrate 101 may be prepared. In an embodiment, the substrate 101 may include a semiconductor material. As an example, the substrate 101 may be a silicon substrate doped with p-type dopants.

Next, a trench 10 may be formed in the substrate 101. The trench 10 may be formed to extend from a surface of the substrate 101 to an inner region of the substrate 101. In an embodiment, the trench 10 may be formed by selectively patterning the substrate 101 using an anisotropic etching method.

Figure 6:
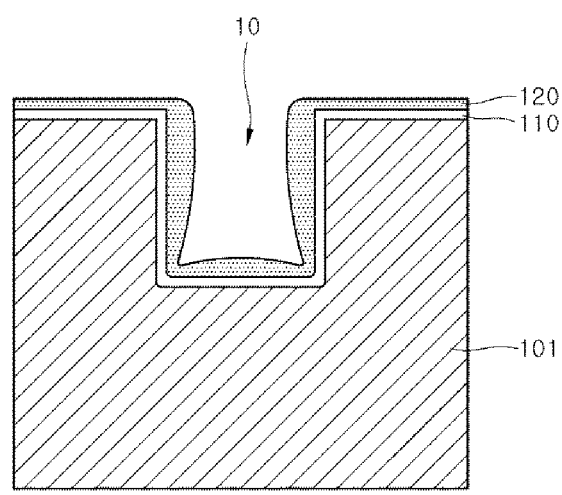

Referring to FIG. 6, an interfacial insulation layer 110 may be formed along an inner wall of the trench 10 and outside the trench 10 on substrate 101. The interfacial insulation layer 110 may include, for example, a nitride, an oxide or an oxynitride. The interfacial insulation layer 110 may include a silicon oxide, a silicon nitride, a silicon oxynitride, an aluminum oxide, or a combination of two or more thereof as non-limiting examples.

The interfacial insulation layer 110 may be formed to have a uniform thickness on the inner wall of the trench 10. As an example, the interfacial insulation layer 110 may be formed using a chemical vapor deposition method, or an atomic layer deposition method. In some embodiments, the interfacial insulation layer 110 may be omitted.

Next, a ferroelectric gate insulation layer 120 may be formed on the interfacial insulation layer 110. The ferroelectric gate insulation layer 120 may include a ferroelectric material such as a hafnium oxide, a zirconium oxide, a hafnium zirconium oxide, or a combination of two or more thereof as non-limiting examples. In an embodiment, the ferroelectric gate insulation layer 120 may include at least one kind of dopant. The dopant may include copper (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof as non-limiting examples.

The ferroelectric gate insulation layer 120 may be formed to have a variable thickness on the interfacial insulation layer 110. The ferroelectric gate insulation layer 120 may be formed using a chemical vapor deposition process. Here, the ferroelectric gate insulation layer 120 may be formed to have a non-uniform thickness by controlling deposition conditions such as a process temperature, a process pressure, or a source gas flow rate of the chemical vapor deposition process as non-limiting examples. Although it is not necessarily described or limited in any one theory, a process of forming the ferroelectric gate insulation layer 120 may include the steps of providing a source gas into a deposition reactor; decomposing the source gas in the deposition reactor; adsorbing the decomposed source gas on the interfacial insulation layer 110, the adsorbed source gas moving to an energetically stable site on the interfacial insulation layer 110; chemically reacting the source gas with the underlying layer at the stable site to form a thin film; and desorbing by-products resulting from the chemical reaction from the reaction surface and discharging the by-products in a gaseous state.

In an embodiment, the deposition conditions may be controlled to increase the rate at which the source gas is adsorbed on the interfacial insulation layer 110 relative to the rate at which the adsorbed source gas moves on the interfacial insulation layer 110. As a result, the ferroelectric gate insulation layer 120 can be formed to have a non-uniform thickness on the interfacial insulation layer 110. The thickness of the ferroelectric gate insulation layer 120 may be relatively increased in a portion of the trench 10 where the probability of the source gas adsorption is relatively high. As an example, in the case of a side wall portion of the trench 10, the thickness of an upper region may be increased rather than a lower region. Further, in the case of a bottom portion of the trench 10, the thickness of a middle region may be increased rather than both side regions.

In some embodiments, the interfacial insulation layer 110 may be omitted, and the ferroelectric gate insulation layer 120 can be formed to have a non-uniform thickness on the substrate 101 by controlling the deposition conditions, such as those described herein for example, on the inner wall surface of the trench 10.

Figure 7:
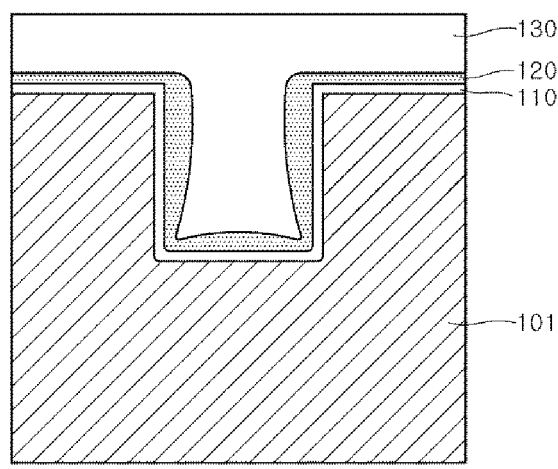

Referring to FIG. 7, in an embodiment, a gate electrode layer 130 may be formed on a ferroelectric gate insulation layer 120 in the trench 10. The gate electrode layer 130 may be formed to fill the trench 10. The gate electrode layer 130 may be disposed on the ferroelectric gate insulation layer 120 outside the trench 10.

The gate electrode layer 130 may include, tungsten (W), titanium (Ti), copper (Cu), aluminum (Al), platinum (Pt), iridium (Ir), ruthenium (Ru), a tungsten nitride, a titanium nitride, a tantalum nitride, an iridium oxide, a ruthenium oxide, a tungsten carbide, a titanium carbide, a tungsten silicide, a titanium silicide, a tantalum silicide, or a combination of two or more thereof as non-limiting examples. The gate electrode layer 130 may be formed using a chemical vapor deposition method, an atomic layer deposition method, or a sputtering method as non-limiting examples.

Figure 8:
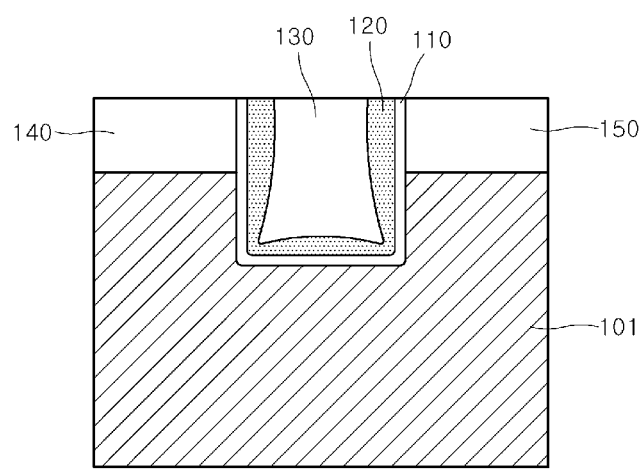

Referring to FIG. 8, in an embodiment, a gate electrode layer 130, a ferroelectric gate insulation layer 120, a interfacial insulation layer 110 formed or deposited outside the trench 10 may be removed applying a planarization process or a selective etching process. The process of removing the layers may be performed until a surface of the substrate 101 outside the trench 10 is exposed.

Next, source and drain regions 140 and 150, respectively, may be formed in the substrate 101 at both ends or opposite sides of the trench 10. The source and drain regions 140 and 150 may be formed by selectively implanting n-type impurities into the substrate 101. As an example of the implantation method, an ion implantation method may be applied.

By performing the above-described process, a ferroelectric memory device according to an embodiment of the present disclosure can be manufactured. The ferroelectric memory device to be manufactured may be substantially the same as the ferroelectric memory device 1 described above and with reference to FIGS. 1A, 1B and 2.

Figure 9:
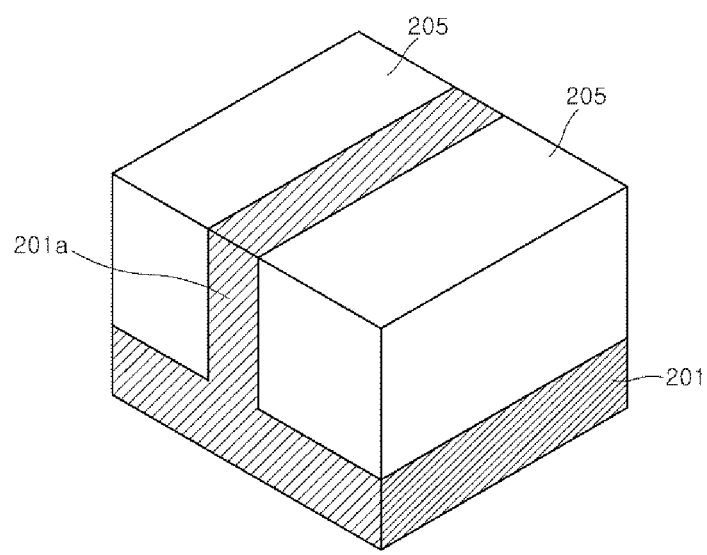
FIGS. 9, 10, 11A, 11B, 11C, 12 and 13 are views schematically illustrating a method of manufacturing a ferroelectric memory device according to an embodiment of the present disclosure.
Figure 10:
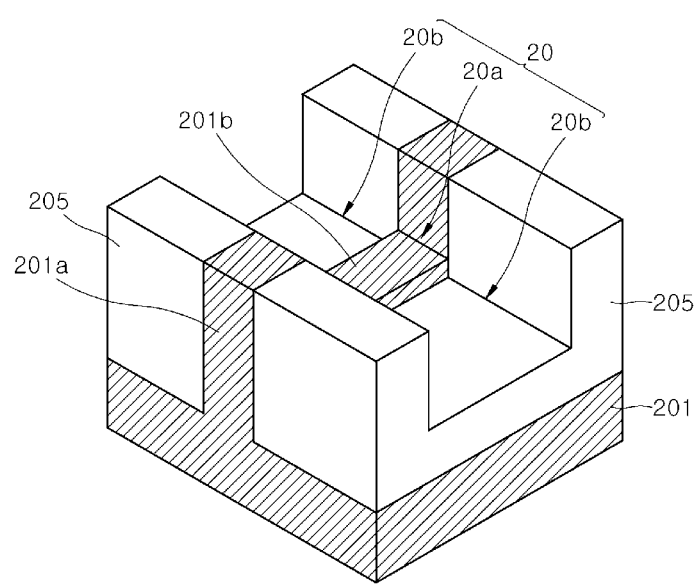
Figure 11A:
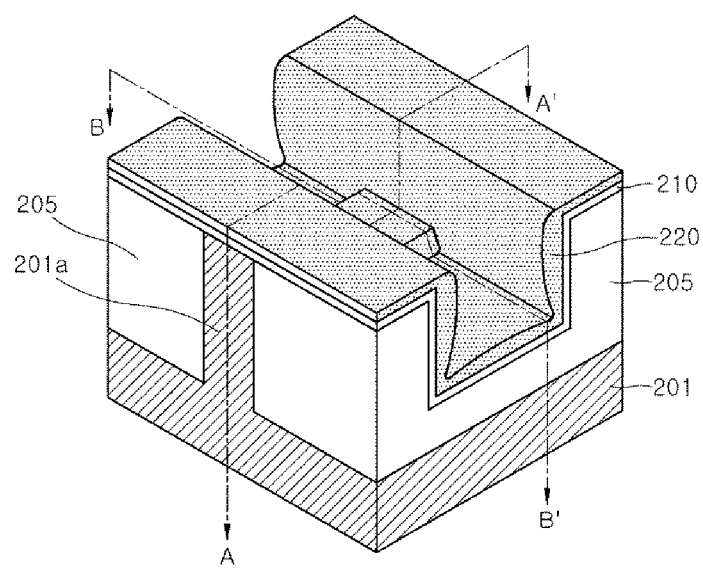
Figure 11B:
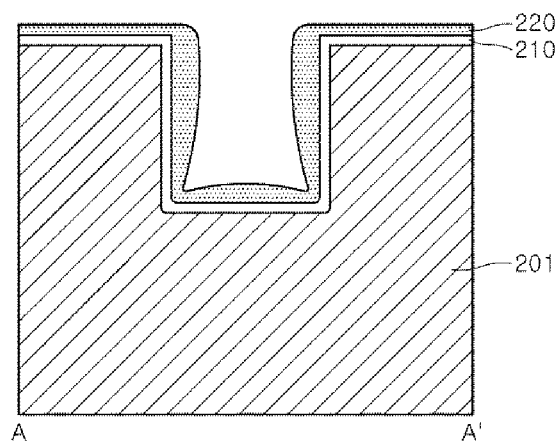
Figure 11C:
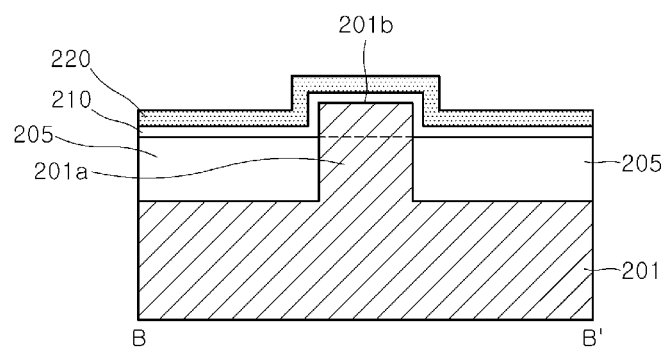

FIGS. 9, 10, 11A, 11B, 11C, 12 and 13 are views schematically illustrating a method of manufacturing a ferroelectric memory device according to an embodiment of the present disclosure. Specifically, FIGS. 9, 10, 11A, 12 and 13 are perspective views and FIGS. 11B and 11C are cross-sectional views taken along line A-A' and B-B', respectively, of FIG. 11A.

Referring to FIG. 9, a substrate 201 may be prepared. As an example, the substrate 201 may be a silicon substrate doped with p-type impurities.

Next, the substrate 201 may be selectively anisotropically etched to form a fin structure 201a protruding to an upper portion of the substrate 201. Then, an insulation layer 205 may be formed to surround the fin structure 201a on the substrate 201. Here, an upper surface of the fin structure 201a and an upper surface of the insulation layer 205 may be subject to a planarization process so that the upper surfaces are located on substantially the same plane. The insulation layer 205 may be formed using a chemical vapor deposition method, a coating method, or the like as non-limiting examples. The planarization method applied may be a chemical mechanical polishing method or an etch-back method as non-limiting examples.

Referring to FIG. 10, in an embodiment, the fin structure 201a and the insulation layer 205 may be respectively etched to form a trench 20. More specifically, the fin structure 201 of FIG. 9 may be selectively etched to form a first trench 20a. Then, the insulation layer 205 may be selectively etched to form second trenches 20b on either side of first trench 20a. The etch depth of the insulation layer 205 may be greater than the etch depth of the fin structure 201a. As a result, a fin recess region 201b protruding upward relative to the insulation layer 205 in the trench 20 can be formed. Referring to FIGS. 11A to 11C, an interfacial insulation layer 210 may be formed on the fin recess region 201b, the inner wall of the first trench 20a and upper surface of the fin structure 201a. As illustrated in FIG. 11C, the interfacial insulation layer 210 may be formed on an upper surface and a side surface of the fin recess region 201b. The interfacial insulation layer 210 may be formed to have a uniform thickness.

In an embodiment, the interfacial insulation layer 210 may be formed by depositing an insulating material on the fin recess region 201b, the inner wall of the first trench 20a, upper surface of the fin structure 201a and insulating layer 205. For example, the insulating material is deposited by a chemical vapor deposition method or an atomic layer deposition method. For example, when the fin structure 201a is made of silicon, the interfacial insulation layer 210 may be a silicon oxide layer or a silicon nitride layer.

The interfacial insulation layer 210 may include, for example, a nitride, an oxide or an oxynitride. The interfacial insulation layer 210 may include a silicon oxide, a silicon nitride, a silicon oxynitride, an aluminum oxide, or a combination of two or more thereof as non-limiting examples. In some embodiments, the interfacial insulation layer 210 may be omitted.

Next, a ferroelectric gate insulation layer 220 may be formed on the interfacial insulation layer 210. The ferroelectric gate insulation layer 220 may be formed by depositing a ferroelectric material on the interfacial insulation layer 210, for example, using a chemical vapor deposition process. As illustrated in FIG. 11B, the ferroelectric gate insulation layer 220 may be formed to have a variable thickness along an inner wall of the first trench 20a and second trenches 20b. The ferroelectric gate insulation layer 220 may be formed to have a non-uniform thickness on the interfacial insulation layer 210 by controlling deposition conditions such as a process temperature, a process pressure, or a source gas flow rate of the chemical vapor deposition process as non-limiting examples. As illustrated in FIG. 11C, the ferroelectric gate insulation layer 220 may be formed on the interfacial insulation layer 210 located on the upper surface and the side surface of the fin structure 201a. In some embodiments, the interfacial insulation layer 210 may be omitted, and the deposition conditions for forming the ferroelectric gate insulation layer 220 may be controlled such that the ferroelectric gate insulation layer 220 has a non-uniform thickness in first trench 20a and second trenches 20b.

The ferroelectric gate insulation layer 220 may include a ferroelectric material. The ferroelectric material may include a hafnium oxide, a zirconium oxide, a hafnium zirconium oxide, or a combination thereof as non-limiting examples. In an embodiment, the ferroelectric gate insulation layer 220 may include at least one kind of dopant. The dopant may include, for example, copper (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof as non-limiting examples.

Figure 12:
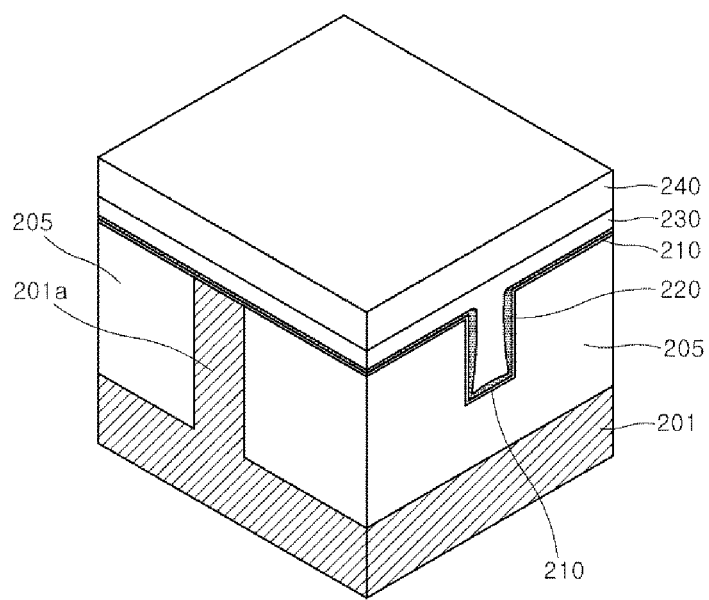

Referring to FIG. 12, a gate electrode layer 230 and an upper conductive layer 240 may be sequentially formed on the ferroelectric gate insulation layer 220. The gate electrode layer 230 may include, for example, tungsten (W), titanium (Ti), copper (Cu), aluminum (Al), platinum (Pt), iridium (Ir), ruthenium (Ru), a tungsten nitride, a titanium nitride, a tantalum nitride, an iridium oxide, a ruthenium oxide, a tungsten carbide, a titanium carbide, a tungsten silicide, a titanium silicide, a tantalum silicide, or a combination thereof as non-limiting examples. The gate electrode layer 230 may be formed, for example, using a chemical vapor deposition method, an atomic layer deposition method, or a sputtering method as non-limiting examples. The upper conductive layer 240 may include a metal material. In an embodiment, the upper conductive layer 240 may have a lower electrical resistance than the gate electrode layer 230. The upper conductive layer 240 may include copper (Cu), aluminum (Al), tungsten (W) or the like as non-limiting examples. The upper conductive layer 240 may be formed, for example, using a chemical vapor deposition method, an atomic layer deposition method, or a sputtering method as non-limiting examples.

Figure 13:
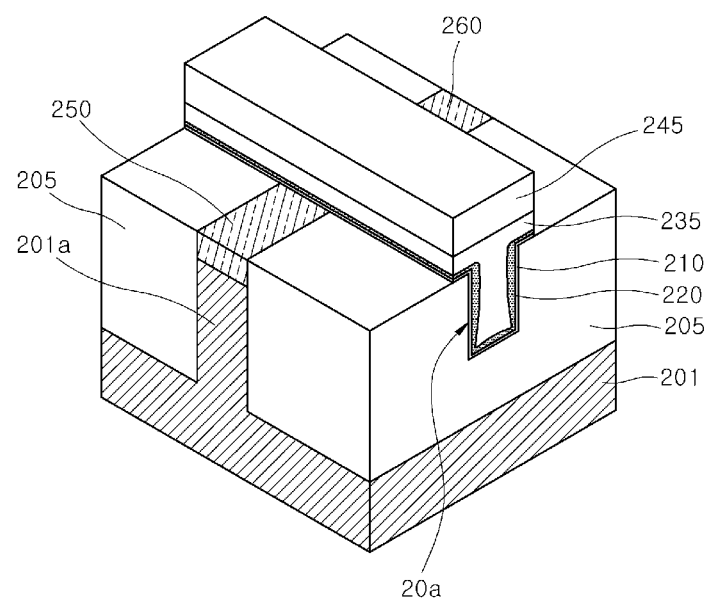

Referring to FIG. 13, the upper conductive layer 240 and the gate electrode layer 230 may be selectively etched to form an upper conductive layer 245 and a gate electrode layer 235. Next, portions of the fin structure 201*a* at least partially in common to the gate electrode layer 235 may be doped with dopants to form a source region 250 and a drain region 260. The source and drain regions 250 and 260 may be formed by selectively implanting n-type impurities into the fin structure 201*a*. For example, an ion implantation method may be applied.

By performing the above-described processes, a ferroelectric memory device according to an embodiment of the present disclosure can be manufactured. A structure of the ferroelectric memory device to be manufactured may be substantially the same as that of the ferroelectric memory device 2 described above and with reference to FIGS. 4A to 4C.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A ferroelectric memory device comprising:
   a substrate;
   an interfacial insulation layer disposed along an inner wall of a trench formed in the substrate;
   a ferroelectric gate insulation layer disposed on the interfacial insulation layer; and
   a gate electrode layer disposed on the ferroelectric gate insulation layer,
   wherein the interfacial insulation layer has a substantially uniform thickness and the ferroelectric gate insulation layer has a variable thickness on the interfacial insulation layer,
   wherein, when a predetermined write voltage is applied to the gate electrode layer, the ferroelectric gate insulation layer has a first region in which a first electric field corresponding to a minimum thickness of the ferroelectric insulation layer is formed, a second region in which a second electric filed corresponding to a maximum thickness of the ferroelectric insulation layer is formed, and a third region in which a third electric field that is greater in magnitude than the first electric field and lower in magnitude than the second electric field is formed.

2. The ferroelectric memory device of claim 1, wherein the ferroelectric gate insulation layer has a ferroelectric characteristic along the same hysteresis loop over the first to third regions.

3. The ferroelectric memory device of claim 2, wherein, when an absolute value of the first electric field is less than an absolute value of a coercive electric field of the ferroelectric gate insulation layer, a polarization orientation of the ferroelectric gate insulation layer is not changed by the write voltage;
   wherein when the absolute value of the first electric field is equal to or greater than the absolute value of the coercive electric field of the ferroelectric gate insulation layer and the absolute value of the second electric field is less than the absolute value of the coercive electric field of the ferroelectric gate insulation layer, the polarization orientation of the first region and at least a portion of the third region is changed by the write voltage; and
   wherein when the absolute value of the second electric field is equal to or greater than the absolute value of the coercive electric field of the ferroelectric gate insulation layer, the polarization orientation of the first region, second region, and third region is changed by the write voltage.

4. The ferroelectric memory device of claim 3, wherein, when the predetermined write voltage corresponds to an electric field in a range between the absolute value of the first electric field and the absolute value of the second electric field, the write voltage controls a size of a portion of the third region where the polarization orientation is changed.

5. The ferroelectric memory device of claim 1, wherein the substrate comprises a doped semiconductor material.

6. The ferroelectric memory device of claim 1, wherein the ferroelectric gate insulation layer comprises at least one oxide among a hafnium oxide, a zirconium oxide, and a hafnium zirconium oxide.

7. The ferroelectric memory device of claim 6, wherein the ferroelectric gate insulation layer comprises at least one dopant selected from carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), and lanthanum (La).

8. The ferroelectric memory device of claim 1, wherein the gate electrode layer comprises at least one selected from tungsten (W), titanium (Ti), copper (Cu), aluminum (Al), platinum (Pt), iridium (Ir), ruthenium (Ru), a tungsten nitride, a titanium nitride, a tantalum nitride, an iridium oxide, a ruthenium oxide, a tungsten carbide, a titanium carbide, a tungsten silicide, a titanium silicide, and a tantalum silicide.

9. The ferroelectric memory device of claim 1, further comprising
an interfacial insulation layer disposed between the inner wall of the trench and the ferroelectric gate insulation layer.

10. The ferroelectric memory device of claim 1, further comprising
source and drain regions disposed in the substrate at both ends of the trench.

* * * * *